Feb. 15, 1955

K. SEILER ET AL

SEMICONDUCTOR RECTIFIER OR AMPLIFIER OF ANY DESIRED SURFACE PROFILE 2,702,361

Filed July 3, 1952

3 Sheets-Sheet 1

INVENTORS
K. SEILER-
L. FEDOTOWSKI
BY Philip M. Bolton
ATTORNEY

Feb. 15, 1955 K. SEILER ET AL 2,702,361
SEMICONDUCTOR RECTIFIER OR AMPLIFIER
OF ANY DESIRED SURFACE PROFILE
Filed July 3, 1952 3 Sheets-Sheet 2

INVENTORS
K. SEILER-
L. FEDOTOWSKI
BY Philip M. Bolton
ATTORNEY

INVENTORS
K. SEILER
L. FEDOTOWSKI
BY Philip M. Bolton
ATTORNEY

United States Patent Office 2,702,361

Patented Feb. 15, 1955

2,702,361

SEMICONDUCTOR RECTIFIER OR AMPLIFIER OF ANY DESIRED SURFACE PROFILE

Karl Seiler, Nurnberg (Bavaria), Germany, and Leonid Fedotowski, Montreal, Quebec, Canada, assignors to International Standard Electric Corporation, New York, N. Y., a corporation of Delaware Application July 3, 1952, Serial No. 297,144

Claims priority, application Germany July 3, 1951

4 Claims. (Cl. 317—235)

The invention relates to crystal contacts of the type in which a semiconducting crystal is in contact with one or more metal wires which are secured in position by grooves or other depressions in the surface of the semiconductor. The invention relates also to the manufacture of such grooves in the semiconductor.

According to the prior art it is known that electric rectifying and amplifying devices which are also known as crystal rectifiers (detectors) and crystal amplifiers (transistors) consist of a semiconducting crystal and one or more thin wires in contact with the surface of the semiconductor. It is also known that these pointed contacts may be secured in position by grooves or other depressions in its surface.

In particular, crystal triodes require their two pointed contacts or electrodes to be held in position because they require the contacts bearing against them, to be spaced apart at a very small distance. It has also been proposed that intersecting lines be provided in the surface of the crystal. But in this case the small mutual distance of the contact points requires a microscope to be used when the contacts are being arranged.

The invention provides for arranging the pointed contacts safely and in a simple manner at any desired point of the crystal. According to the invention parallel lines or grooves are so arranged that their ends face each other but are spaced apart at a very small distance, viz. a distance from about 30$\mu$ to several 100$\mu$. The ends of the grooves thus almost contact with each other, not doing so perfectly. The pointed ends of the contacts or electrodes are introduced each into one groove and then moved to the end thereof. Accordingly, if a pair of such electrodes is concerned, as in the case of crystal triodes, the two pointed ends of the electrodes will then be opposite each other, being spaced apart by the mutual distance of the groove ends.

There are a number of methods for producing the desired system of grooves. For instance, some insulating material may in any suitable manner, as by sputtering or some printing method, be applied to the semi-conductor in such a manner that certain parts thereof shall not be covered with insulating material. These parts will be the bottom of grooves, the coating formed by the insulating material being of the proper configuration. This configuration or pattern may be determined by a mask or stencil and may be in the nature of lines or strips. Furthermore, grooves so obtained may be made deeper by etching or by means of a tool. Also it may be practicable to pierce an insulating coating of the semi-conductor by means of a suitable tool and in this way to produce the grooves.

According to the invention, a preferred method of producing such grooves is employed, the semi-conductor being immersed in a viscous liquid which contains hard particles suspended in it and a piston of hard metal having knife edges at its lower end is oscillated in the liquid in small distance from the surface of the semi-conductor.

Another object of the present invention is to adjust the two electrodes relatively to one another by moving the crystal relatively to them whereby the electrodes would slide in the grooves.

The above-mentioned and other features and objects of this invention and the manner of attaining them will become more apparent and the invention itself will be best understood by reference to the following description in conjunction with the accompanying drawings wherein:

Fig. 1 shows an arrangement of grooves in an insulating layer on the semi-conductor in ground plan.

Fig. 1*a* shows a section on line A—A of Fig. 1.

Fig. 1*b* shows a section on line B—B of Fig. 1.

Figure 3:
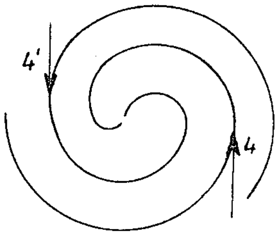
Fig. 3 represents a spiral-shaped arrangement of the grooves with two spirals.
Figure 3A:
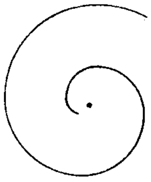

Fig. 3*a* shows a spiral-shaped arrangement of the grooves with one spiral.

Figure 3B:
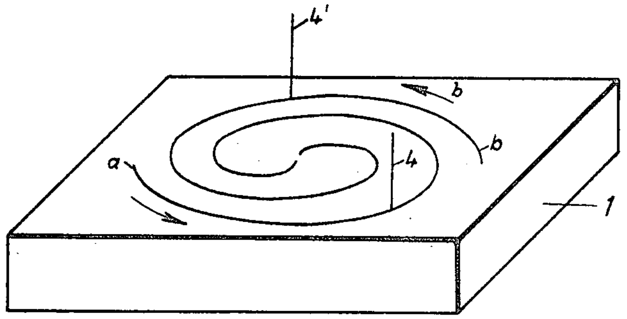
Figure 3C:
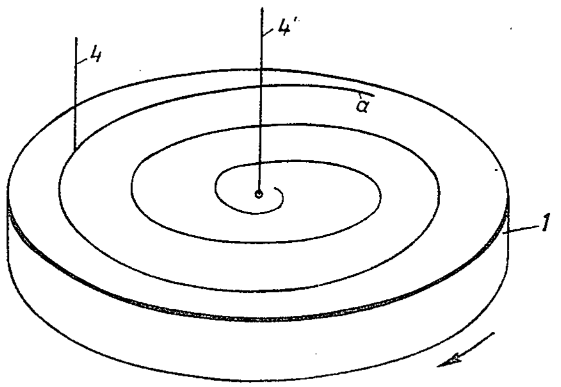

Figs. 3*b* and 3*c* show the semi-conductor with the grooves and the contact wires and the adjusting of the two electrodes.

Figure 4:
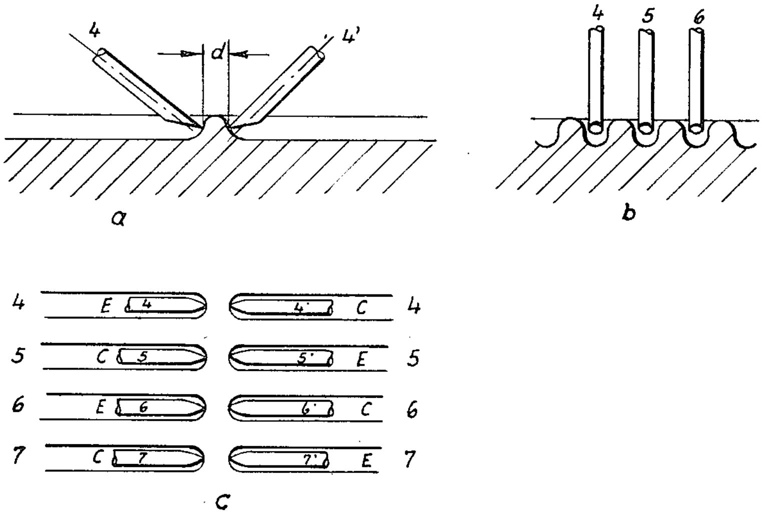

Figs. 4*a*, *b* and *c* illustrate a system with grooves in the semi-conductor itself and the electrodes arranged therein.

Fig. 4*a* is a sectional elevation, Fig. 4*b* a sectional side view and Fig. 4*c* a plan view.

Figure 5A:
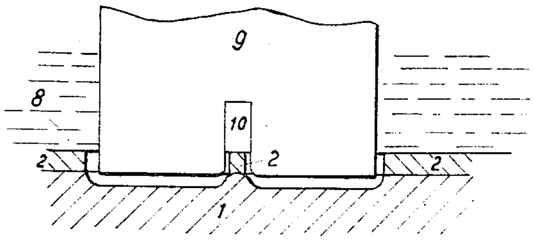

Figs. 5*a* and *b* illustrate the method of producing the grooves in the semi-conductor according to the invention.

Figure 5B:
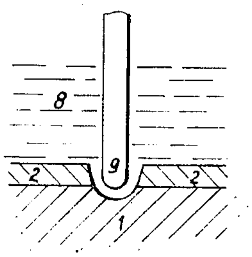

Fig. 5*a* shows a sectional elevation and Fig. 5*b* a sectional side view.

Figure 1A:
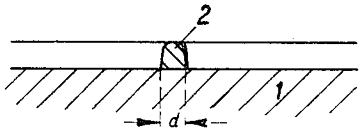
Figure 1B:
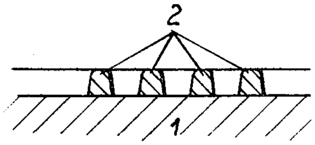
Figure 1:
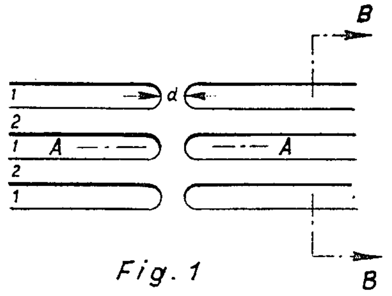

One embodiment of the invention is represented in Figs. 1, 1*a*, 1*b*. Fig. 1 is a plan view, Fig. 1*a* shows a section on line A—A, Fig. 1*b* a section on line B—B of Fig. 1. A plate 1 of germanium carries an insulating coating 2 so configurated that there are grooves whose bottom is constituted by plate 1 and whose side walls are constituted by coating 2. In some cases the coating 2 will suffice to guide the pointed contacts. In other cases the grooves may be made deeper by etching. The grooves face each other in pairs, as can be seen in Fig. 1. Those of each pair are spaced apart at distance *d* which is about as small as 30 or 200$\mu$. If two pointed contacts are moved toward each other in a pair of grooves, they will arrive in a position defined by distance *d*.

Figure 2:
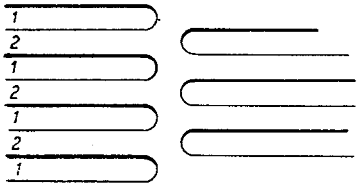
Fig. 2 shows another arrangement of the grooves.

Fig. 2 shows the grooves as off-set with respect to each other.

In Fig. 3 a spiral-shaped arrangement of the grooves is represented. Two spirals are shown whose inner ends are opposite each other. The distance between these ends corresponds to distance *d* shown in Figs. 1*a* and 1. After the two pointed contacts or contact needles have been inserted into the two spiral grooves so that either groove has a contact 4, 4' in engagement with it, the pointed ends of the contacts will be moved toward each other simply by rotation of the structure that has the grooves. As shown in Fig. 3*a*, one of the spiral grooves may be reduced to a point around which the rotation determining the mutual position of the contact ends is accomplished.

Fig. 3*b* shows a thin plate 1 of a semiconductor such as germanium with two spiral grooves according to Fig. 3. The needle electrodes 4 and 4' have been inserted in the grooves at the starting points *a* and *b*. By moving the carrier (not shown) on which the needle electrodes are fastened, the needles 4 and 4' would slide in the grooves. The turning direction is shown by the two arrows. While moving, the distance between the needles reduces and in the end position, the needle electrodes have a minimum distance. The carrier of the needle electrodes also can be held fast and the crystal carrier can be turned. By turning a larger or smaller angle the distance between the needle electrode is smaller or larger.

Fig. 3*c* shows another embodiment of the inventive method. The semi-conductor 1 has a spiral-shaped groove and a point shaped groove on its surface according to Fig. 3*a*. The point-shaped groove is preferably arranged in the centre of the crystal plate and a needle electrode 4' there is inserted. The other needle 4 is inserted in the spiral-shaped groove at the starting point *a* and by turning the crystal plate in the direction marked by the arrow, a desired distance between the two needle electrodes is adjusted.

In Figs. 4*a*, 4*b*, 4*c* a system as provided by the invention is illustrated as a whole, the contacts or electrodes being shown too. Fig. 4*a* is a sectional elevation, Fig. 4*c* a plan view, Fig. 4*b* a sectional side view. In this case the semi-conductor crystal has no coating arranged to form the grooves but these are provided in the crystal itself. The electrodes are arranged in pairs 4, 4', 5, 5', 6, 6', 7, 7'. One electrode of each pair is called an emitter, the other called a collector. The pointed ends of the electrodes may be wedge-shaped, as shown in Fig. *4a*.

As is well known, difficulties arise in an attempt to produce depressions in a germanium or silicon surface by etching. In fact, small bubbles may form at the etching spot and prevent further influence of the etching liquid, or the etching liquid may happen to undergo variation at points in close proximity to the material to be removed by the etching process, whereby this may be retarded or cease at all.

The invention therefore employs the method described hereafter, reference being had to Figs. *5a, 5b*. Fig. *5a* is a sectional elevation, Fig. *5b* a sectional side view. The semi-conductor plate 1 is immersed in a viscous etching liquid 8 which contains hard particles suspended in it, such as emery powder, or diamond or Carborundum dust. A piston or die 9 of hard metal or other suitable material has knife edges at its lower end which represent a positive of the pattern to be produced in plate 1 by etching. This die is so positioned that its lower end is in close proximity to plate 1 but does not contact therewith. An ultrasonic wave generator, not shown, i. e. a generator producing high frequency sound waves, causes the die to oscillate in directions normal to the semi-conductor face to be etched. The hard particles suspended in liquid 8 are pushed downward by the knife edges in a manner to be thrown again and against this face, which is thus attacked by the impact of these particles. At the same time, however, the motion of the particles causes the etching liquid in the reach of the knife-edges to be renewed again and again by way of circulation and thus prevents change of concentration. Owing to a slot 10 in the lower end of die 9 the ends of the lines or grooves so produced will keep to the aforesaid distance *d* between them.

Die 9 should of course be of a material not corroded by the etching liquid. If this material does not conduct electricity and if etching is to be aided by an electric current, an electrode must be immersed in the etching liquid. The other pole of the current source will have to be joined to the semi-conductor. In any case, even if the die be conductive, a third electrode may be arranged in the liquid in order to carry away the particles detached from the semi-conductor by the etching process. To achieve this, the die and semi-conductor as well as the said third electrode must be given certain potential differences. The circuit for conveying the products of etching may, however, be bipolar and separate from the circuit that serves etching.

Where gassing occurs between the die and semi-conductor, the bubbles will be destroyed by the high pressures brought about the ultrasonic waves and will in a sense be washed away by the motion or circulation of the liquid. Circulation of the etching liquid is thus of high advantage.

While we have described above the principles of our invention with reference to the accompanying drawings in connection with specific embodiments it is to be clearly understood that this description is made only by way of example and not as a limitation to the scope of our invention as set forth in the objects thereof and in the accompanying claims.

What is claimed is:

1. A semi-conductor crystal for use as a rectifier or amplifier and having several pointed electrodes contacting with it, characterized in that the semi-conductor has grooves provided in its surface, that further these grooves have ends which face each other and are spaced apart at a very small distance, and that the pointed electrodes are inserted in the grooves at said ends thereof so as to be opposite each other.

2. A semi-conductor crystal as in claim 1, characterized in that the grooves are parallel to each other and are arranged in two systems which have groove ends facing each other and spaced apart at a small distance, the grooves of each system being in alignment with those of the other system.

3. A semi-conductor crystal as in claim 1, characterized in that the grooves are in the shape of spirals whose inner ends are spaced apart at a small distance.

4. A semi-conductor crystal as in claim 3, characterized in that one groove is reduced to a point spaced away a small distance from the end of the other groove.

References Cited in the file of this patent

UNITED STATES PATENTS

| | | |
|---|---|---|
| 2,560,579 | Kock et al. | July 17, 1951 |
| 2,563,503 | Wallace | Aug. 7, 1951 |
| 2,629,800 | Pearson | Feb. 24, 1953 |
| 2,634,322 | Law | Apr. 7, 1953 |